US009502510B2

United States Patent
Zampardi et al.

(10) Patent No.: US 9,502,510 B2
(45) Date of Patent: Nov. 22, 2016

(54) HETEROJUNCTION BIPOLAR TRANSISTORS FOR IMPROVED RADIO FREQUENCY (RF) PERFORMANCE

(71) Applicant: RF Micro Devices, Inc., Greensboro, NC (US)

(72) Inventors: Peter J. Zampardi, Newbury Park, CA (US); Brian G. Moser, Jamestown, NC (US); Jing Zhang, Greensboro, NC (US); Thomas James Rogers, Greensboro, NC (US); Dheeraj Mohata, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/744,275

(22) Filed: Jun. 19, 2015

(65) Prior Publication Data

US 2015/0372098 A1  Dec. 24, 2015

Related U.S. Application Data

(60) Provisional application No. 62/014,407, filed on Jun. 19, 2014.

(51) Int. Cl.
*H01L 29/66* (2006.01)
*H01L 29/205* (2006.01)
*H01L 29/737* (2006.01)
*H01L 29/08* (2006.01)

(52) U.S. Cl.
CPC ......... *H01L 29/205* (2013.01); *H01L 29/0821* (2013.01); *H01L 29/66242* (2013.01); *H01L 29/7371* (2013.01); *H01L 29/0817* (2013.01)

(58) Field of Classification Search
CPC ........... H01L 29/0804; H01L 29/0813; H01L 29/0817; H01L 29/66234; H01L 29/66242; H01L 29/73; H01L 29/737
See application file for complete search history.

(56) References Cited

U.S. PATENT DOCUMENTS

| 7,038,256 | B1* | 5/2006 | Sawdai | H01L 29/0817 257/197 |
| 2003/0032252 | A1* | 2/2003 | Pan | H01L 29/0817 438/312 |
| 2007/0023783 | A1* | 2/2007 | Hase | H01L 29/0817 257/197 |
| 2010/0078623 | A1* | 4/2010 | Feng | H01L 33/0016 257/13 |
| 2012/0256554 | A1* | 10/2012 | Um | H05B 33/0827 315/224 |

OTHER PUBLICATIONS

Chand, N. et al., "Collector-emitter offset voltage in AlGaAs/GaAs heterojunction bipolar transmitters," Applied Physics Letters, vol. 47, No. 3, 1985, pp. 313-315.

(Continued)

*Primary Examiner* — Jae Lee
(74) *Attorney, Agent, or Firm* — Withrow & Terranova, P.L.L.C.

(57) ABSTRACT

The present disclosure relates to heterojunction bipolar transistors for improved radio frequency (RF) performance. In this regard, a heterojunction bipolar transistor includes a base, an emitter, and a collector. The base is formed over the collector such that a base-collector junction is formed between the base and the collector. The base-collector junction is configured to become forward-biased at a first turn-on voltage. The emitter is formed over the base such that a base-emitter junction is formed between the base and the emitter. The base-emitter junction is configured to become forward-biased at a second turn-on voltage, as opposed to the first turn-on voltage. Notably, the second turn-on voltage is lower than the first turn-on voltage.

25 Claims, 12 Drawing Sheets

(56) References Cited

OTHER PUBLICATIONS

Cismaru, C. et al., "Experimental Comparison of Ic-Vce Parameters and Large-Signal Performance for III-V HBTs," Proceedings of the Bipolar/BiCMOS Circuits and Technology Meeting, 2005, IEEE, Oct. 9-11, 2005, pp. 212-215.

McAlister, S. P. et al., "Interpretation of the Common-Emitter Offset Voltage in Heterojunction Bipolar Transistors," IEEE Transactions on Electron Devices, vol. 48, No. 8, Aug. 2001, pp. 1745-1747.

Mochizuki, K. et al., "Size- and temperature-independent zero-offset current-voltage characteristics of GaInP/GaAs collector-up tunnelling-collector heterojunction bipolar transistors," Electronics Letter, vol. 37, No. 4, Feb. 15, 2001, pp. 252-253.

Moser, B. et al., "Comparison of Technologies for APT and ET Applications," 2015 IEEE Compound Semiconductor Integrated Circuits Symposium (CSICS), Oct. 11-15, 2015, New Orleans, LA, 4 pages.

Stevens, K. S. et al., "Impact of Compositionally Graded Base Regions on the DC and RF Properties of Reduced Turn-On Voltage InGaP—GaInAsN DHBTs," IEEE Transactions on Electron Devices, vol. 51, No. 10, Oct. 2004, pp. 1545-1553.

Welser, R. E. et al., "Pathway for HBT Turn-on Voltage Reduction on a GaAs Platform," ManTech, May 2001, 30 slides.

Yan, B. P. et al., "Low Turn-on Voltage InGaP/GaAsSb/GaAs Double HBTs Grown by MOCVD," IEEE Electronic Device Letters, IEEE, vol. 23, No. 4, Apr. 2002, pp. 170-172.

Zampardi, P. J. et al., "Demonstration of a Low Vref PA Based on InGaAsN Technology" Submission to 2006 Topical Workshop on Power Amplifiers (RWS), Paper 4.4, 2006, 3 pages.

Zampardi, P. J. et al., "Demonstration of a Low Vref PA Based on InGaAsN Technology" Submission to 2006 Topical Workshop on Power Amplifiers (RWS), PowerPoint Presentation, 2006, 16 slides.

Zampardi, P. J. et al., "Power Amplifier Design and Technology: What Really Impacts PAE and Linearity?" 80th ARFTG Microwave Measurement Conference, PowerPoint Presentation, Nov. 29-30, 2012, San Diego, CA, 43 slides.

* cited by examiner

HETEROJUNCTION BIPOLAR TRANSISTORS FOR IMPROVED RADIO FREQUENCY (RF) PERFORMANCE

PRIORITY APPLICATION

This application claims the benefit of U.S. Provisional Patent Application Ser. No. 62/014,407, filed Jun. 19, 2014, the disclosure of which is incorporated herein by reference in its entirety.

FIELD OF THE DISCLOSURE

The present disclosure relates to heterojunction bipolar transistors. Specifically, the present disclosure relates to material configurations for heterojunction bipolar transistors for improved radio frequency performance at lower supply voltages.

BACKGROUND

Transistors are an essential component in modern mobile communications devices. Specifically, transistors play a vital role in the transmission and reception of radio frequency (RF) signals in the front end of a mobile communications device. Due to the decreasing form factor of mobile communications devices, the desire for a longer battery life, and support for an increasing number of stringent wireless communications standards, there is an ongoing need for smaller, more efficient transistor devices with improved performance characteristics.

As will be appreciated by those of ordinary skill in the art, one way to improve the performance of a transistor device operating at high frequencies (e.g., radio frequencies) is by using a heterojunction bipolar transistor. At high frequencies, heterojunction bipolar transistors offer many performance advantages over homojunction bipolar transistors. The performance advantages offered by conventional heterojunction bipolar transistors primarily arise due to a wider energy bandgap in the material of the emitter of the device as compared to the energy bandgap in the material of the base of the device. The wider energy bandgap of the emitter material allows for many parameters dictating the performance of the device to be optimized for high frequencies without degrading the current gain of the device.

While heterojunction bipolar transistors generally offer performance advantages at high frequencies, multiple types of heterojunction bipolar transistors may each provide particular benefits. For example, a single heterojunction bipolar transistor, wherein one of either a base-emitter junction or a base-collector junction is a heterojunction, typically achieves desirable direct current (DC) gain at higher supply voltages. However, at lower supply voltages, conventional single heterojunction bipolar transistors generally do not provide high DC gain. On the other hand, a double heterojunction bipolar transistor, wherein both the base-emitter and the base-collector junctions are heterojunctions, typically provide high DC gain at both higher and lower supply voltages. Despite such desirable DC performance, conventional double heterojunction bipolar transistors typically do not offer high RF gain at lower supply voltages.

Therefore, it would be advantageous to employ a heterojunction bipolar transistor capable of providing high DC gain across a wide range of supply voltages while also achieving high RF gain at lower supply voltages.

SUMMARY

The present disclosure relates to heterojunction bipolar transistors for improved radio frequency (RF) performance. In this regard, a heterojunction bipolar transistor includes a base, an emitter, and a collector. The base is formed over the collector such that a base-collector junction is formed between the base and the collector. The base-collector junction is configured to become forward-biased at a first turn-on voltage. The emitter is formed over the base such that a base-emitter junction is formed between the base and the emitter. The base-emitter junction is configured to become forward-biased at a second turn-on voltage, as opposed to the first turn-on voltage. Notably, the second turn-on voltage is lower than the first turn-on voltage.

In one embodiment, a heterojunction bipolar transistor is disclosed. The heterojunction bipolar transistor comprises a collector. The heterojunction bipolar transistor further comprises a base formed over the collector such that a base-collector junction is formed between the base and the collector. The base-collector junction is configured to become forward-biased at a first turn-on voltage. The heterojunction bipolar transistor further comprises an emitter formed over the base such that a base-emitter junction is formed between the base and the emitter. The base-emitter junction is configured to become forward-biased at a second turn-on voltage, which is lower than the first turn-on voltage.

In another embodiment, a heterojunction bipolar transistor is disclosed. The heterojunction bipolar transistor comprises a base formed over a collector, wherein a base-collector junction is formed between the base and the collector. The heterojunction bipolar transistor further comprises an emitter formed over the base, wherein a base-emitter junction is formed between the base and the emitter. The emitter has a bandgap near the base-emitter junction approximately equal to 1.32 electronvolts (eV), and the collector has a bandgap near the base-collector junction that is approximately equal to 1.42 eV so that a turn-on voltage of the base-collector junction is higher than a turn-on voltage of the base-emitter junction.

In another embodiment, a method for manufacturing a heterojunction bipolar transistor is disclosed. The method comprises providing a collector on a subcollector. The method further comprises providing a base on the collector such that a base-collector junction is formed between the base and the collector, wherein the base-collector junction is configured to become forward-biased at a first turn-on voltage. The method further comprises providing an emitter on the base such that a base-emitter junction is formed between the base and the emitter, wherein the base-emitter junction is configured to become forward-biased at a second turn-on voltage, which is lower than the first turn-on voltage. The method further comprises providing an emitter cap on the emitter. The method further comprises providing a pair of collector contacts on the subcollector, providing a pair of base contacts on the base, and providing an emitter contact on the emitter cap.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to heterojunction bipolar transistors for improved radio frequency (RF) performance. In this regard, a heterojunction bipolar transistor includes a base, an emitter, and a collector. The base is formed over the collector such that a base-collector junction is formed between the base and the collector. The base-collector junction is configured to become forward-biased at a first turn-on voltage. The emitter is formed over the base such that a base-emitter junction is formed between the base and the emitter. The base-emitter junction is configured to become forward-biased at a second turn-on voltage, as opposed to the first turn-on voltage. Notably, the second turn-on voltage is lower than the first turn-on voltage.

Figure 1:
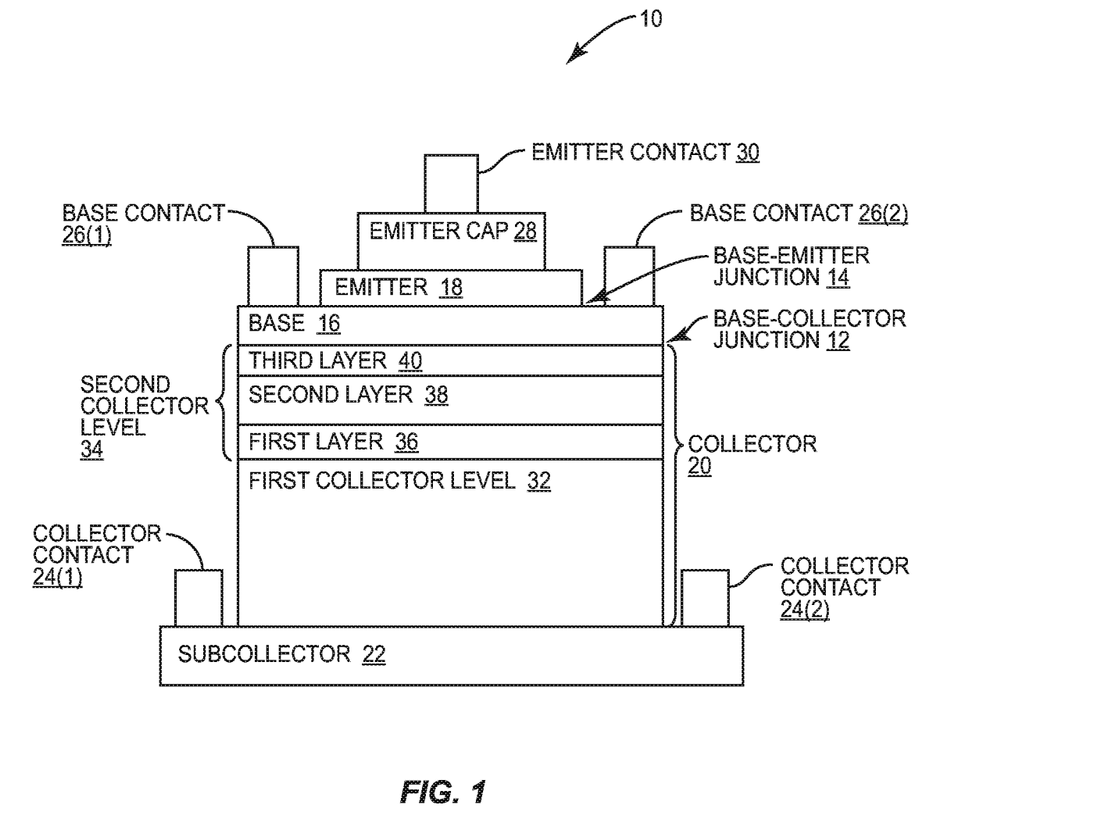
FIG. 1 is a cross-sectional diagram of an exemplary heterojunction bipolar transistor wherein a first turn-on voltage of a base-collector junction is higher than that of a second turn-on voltage of a base-emitter junction.

Before discussing details of the heterojunction bipolar transistor beginning in FIG. 1, details of RF gain generally in heterojunction bipolar transistors are first discussed. In this manner, a heterojunction bipolar transistor typically operates in a forward-active mode of operation by forward-biasing a base-emitter junction while reverse-biasing a base-collector junction of the device. In the forward-active mode of operation of a heterojunction bipolar transistor, a capacitance associated with the base-collector junction ($C_{BC}$) is generally lower due to a relatively wide depletion region surrounding the base-collector junction. However, as the supply voltage provided to the collector decreases, the reverse-bias voltage across the base-collector junction also decreases. Such a decrease in the reverse-bias voltage across the base-collector junction in turn causes the width of the depletion region to similarly decrease, which increases the $C_{BC}$. Importantly, at high frequencies the $C_{BC}$ behaves as a short-circuit, which creates a negative-feedback path between the base and the collector. As the $C_{BC}$ increases, so too does the effect of the negative feedback. Thus, the RF gain of a heterojunction bipolar transistor may be significantly reduced at larger values of the $C_{BC}$. In other words, as the supply voltage decreases below a critical level such that the base-collector junction begins to become forward-biased from its previous reverse-biased state, the $C_{BC}$ of a conventional heterojunction bipolar transistor increases to a level that reduces the RF gain.

FIG. 1 illustrates an exemplary heterojunction bipolar transistor 10 wherein a first turn-on voltage $V_{T1}$ (not shown) of a base-collector junction 12 is higher than a second turn-on voltage $V_{T2}$ (not shown) of a base-emitter junction 14. As a non-limiting example, the heterojunction bipolar transistor 10 may be a double heterojunction bipolar transistor. In this embodiment, the heterojunction bipolar transistor 10 includes a base 16, an emitter 18, and a collector 20. The collector 20 is formed over a subcollector 22, and the base 16 is formed over the collector 20 such that the base-collector junction 12 is formed between the base 16 and the collector 20. Notably, the base-collector junction 12 is configured to become forward-biased at the first turn-on voltage $V_{T1}$. Collector contacts 24(1)-24(2) are also formed over the subcollector 22, while base contacts 26(1)-26(2) are formed over the base 16. The emitter 18 is formed over the base 16, an emitter cap 28 is formed over the emitter 18, and an emitter contact 30 is formed over the emitter cap 28. The base-emitter junction 14 is formed between the base 16 and the emitter 18, wherein the base-emitter junction 14 is configured to become forward-biased at the second turn-on voltage $V_{T2}$. Importantly, the first turn-on voltage $V_{T1}$ is higher than the second turn-on voltage $V_{T2}$.

Designing the heterojunction bipolar transistor 10 so that the first turn-on voltage $V_{T1}$ is higher than the second turn-on voltage $V_{T2}$ may result in a higher RF gain at lower supply voltages as compared to conventional heterojunction bipolar transistors. In particular, increasing the first turn-on voltage $V_{T1}$ increases the voltage necessary to place the base-collector junction 12 into forward-bias, thereby maintaining the width of a depletion region (not shown) surrounding the base-collector junction 12 at lower supply voltages. As a result, the base-collector junction 12 may remain reverse-biased at lower supply voltages, which reduces the $C_{BC}$, thereby maintaining the RF gain at these lower supply voltages. Therefore, configuring the first turn-on voltage $V_{T1}$ of the base-collector junction 12 to be higher than the second turn-on voltage $V_{T2}$ of the base-emitter junction 14 reduces the $C_{BC}$ of the heterojunction bipolar transistor 10 at lower supply voltages, thereby improving the RF gain achieved at such lower supply voltages.

As discussed in further detail below, one way to configure the first turn-on voltage $V_{T1}$ to be higher than the second turn-on voltage $V_{T2}$ is by way of the material employed to form the collector 20. In particular, one or more materials may be employed to form the collector 20 such that the first turn-on voltage $V_{T1}$ is higher than the second turn-on voltage $V_{T2}$. In this embodiment, the collector 20 of the heterojunction bipolar transistor 10 includes a first collector level 32 and a second collector level 34. The first collector level 32 is formed over the subcollector 22, while the second collector level 34 is formed over the first collector level 32. The material employed for the first collector level 32 may be different from the material employed for the second collector level 34. In this manner, one or more materials may be employed for the first collector level 32 and the second collector level 34 such that the bandgap of the collector 20 near the base-collector junction 12 is wider than a bandgap of the base 16 near the base-emitter junction 14. By configuring the material(s) of the collector 20 such that the bandgaps near the base-collector and base-emitter junctions 12, 14 vary in this manner, the first turn-on voltage $V_{T1}$ may be configured to be higher than the second turn-on voltage $V_{T2}$. A higher first turn-on voltage $V_{T1}$ results in a higher required voltage to place the base-collector junction 12 into forward-bias, thereby reducing the $C_{BC}$ and improving the RF gain at lower supply voltages.

In addition to the material(s) of the collector 20, the first turn-on voltage $V_{T1}$ may be further configured to be higher than the second turn-on voltage $V_{T2}$ by manipulating doping concentrations and/or a composition gradient of the base 16 and/or the collector 20. In particular, the doping concentration and/or the material composition of the base 16 may be graded such that the bandgap of a portion of the base 16 near the base-emitter junction 14 is narrower than the bandgap of another portion of the base 16 near the base-collector junction 12. Similarly, the doping concentration and/or the material composition of the collector 20 may be graded such that the bandgap of a portion of the collector 20 near the base-collector junction 12 is wider than the bandgap of a portion of the base 16 near the base-emitter junction 14. As non-limiting examples, the above techniques may be employed such that the bandgap of a portion of the collector 20 near the base-collector junction 12 is approximately 1.42 electronvolts (eV) while the bandgap of a portion of the base 16 near the base-emitter junction 14 is approximately 0.92 eV. Other embodiments may have alternative bandgap values, wherein the bandgap of the portion of the collector 20 near the base-collector junction 12 is at least 0.1 eV greater than the bandgap of a portion of the base 16 near the base-emitter junction 14. Notably, some embodiments may configure the doping concentration and/or composition gradient of the emitter 18 such that the bandgap of a portion of the emitter 18 near the base-emitter junction 14 results in the second turn-on voltage $V_{T2}$ being lower than the first turn-on voltage $V_{T1}$. Further, some embodiments may configure the doping concentration and/or composition gradient of the collector 20 such that the bandgap of the collector 20 decreases or narrows as the distance from the base-collector junction 12 increases.

In this embodiment, the gradient doping concentration of the collector 20 may be achieved by manipulating the doping concentration of the second collector level 34. For example, the doping concentration of the second collector level 34 may be graded such that the bandgap corresponding to a portion of the second collector level 34 near the base-collector junction 12 is wider than the bandgap corresponding to a portion of the base 16 near the base-emitter junction 14. Such a gradient in the doping concentration may be employed by applying varying doping concentrations to different layers of the second collector level 34. To that end, the second collector level 34 in this embodiment includes a first layer 36 formed over the first collector level 32, a second layer 38 formed over the first layer 36, and a third layer 40 formed over the second layer 38. As a non-limiting example, to achieve the gradient in the doping concentration discussed above, the first layer 36 may have a doping concentration between 1e15 cm$^{-3}$ and 1e16 cm$^{-3}$, the second layer 38 may have a doping concentration between 1e18 cm$^{-3}$ and 1e20 cm$^{-3}$, and the third layer 40 may have a doping concentration between 1e15 cm$^{-3}$ and 1e16 cm$^{-3}$. Thus, by manipulating the doping concentrations and/or the composition gradients such that the bandgaps near the base-collector and base-emitter junctions 12, 14 vary in this manner, the first turn-on voltage $V_{T1}$ may be configured to be higher than the second turn-on voltage $V_{T2}$, thereby improving the RF gain at lower supply voltages.

Those skilled in the art will appreciate that the layers in the heterojunction bipolar transistor 10 described above may be grown as individual layers, or each layer may be formed by combining any number of individually grown sublayers.

Figure 2:
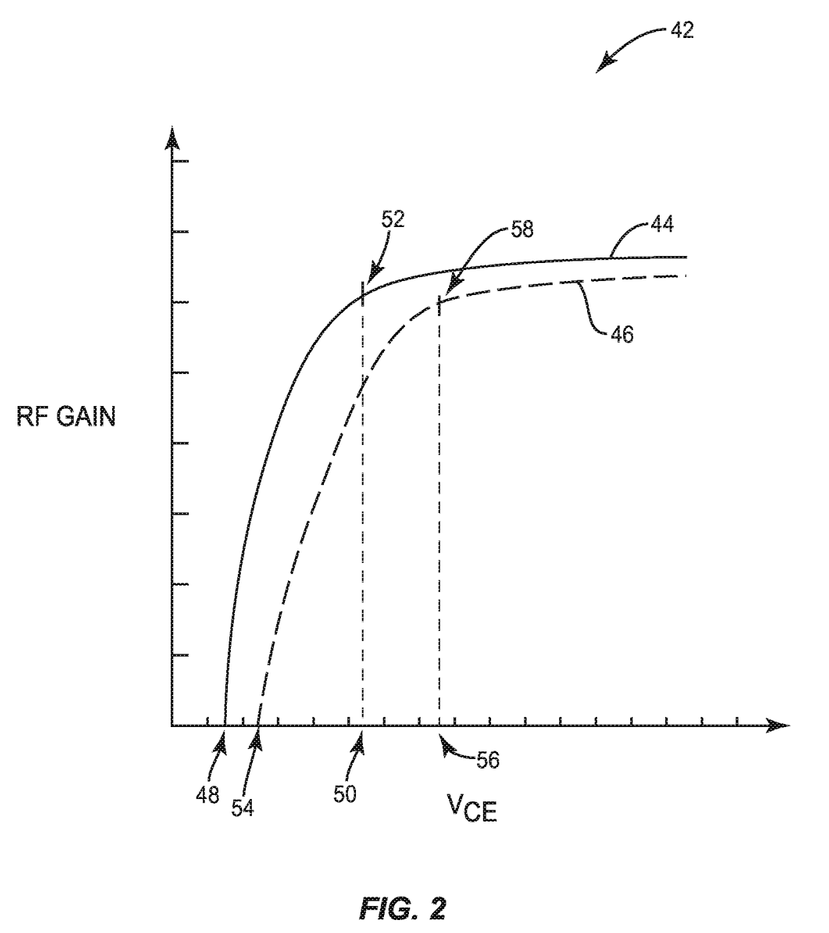
FIG. 2 is a graph that illustrates a collector-emitter voltage versus a radio frequency (RF) gain of the heterojunction bipolar transistor in FIG. 1.

Turning now to FIG. 2, a graph 42 illustrates RF gain versus collector-emitter voltage ($V_{CE}$) (i.e., the supply voltage) of both the heterojunction bipolar transistor 10 in FIG. 1 and a conventional heterojunction bipolar transistor. In particular, a line 44 represents the RF gain-$V_{CE}$ relationship of the heterojunction bipolar transistor 10, wherein the heterojunction bipolar transistor 10 is configured as a double heterojunction bipolar transistor. Further, a dashed line 46 represents the RF gain-$V_{CE}$ relationship of a conventional double heterojunction bipolar transistor. As a non-limiting example, the heterojunction bipolar transistor 10 represented by the line 44 may be configured to have a first turn-on voltage $V_{T1}$ approximately equal to 1.4 V and a second turn-on voltage $V_{T2}$ approximately equal to 1.3 V. In other words, the base-collector junction 12 is configured to become forward-biased at 1.4 V, and the base-emitter junction 14 is configured to become forward-biased at 1.3 V. Conversely, the conventional double heterojunction bipolar transistor represented by the dashed line 46 may be configured such that its base-emitter junction becomes forward-biased at 1.3 V, while its base-collector junction becomes forward-biased at 1.2 V. Notably, while the example above includes the first turn-on voltage $V_{T1}$ approximately 0.1 V greater than the second turn-on voltage $V_{T2}$, alternative embodiments may be configured such that the first turn-on voltage $V_{T1}$ is up to 0.4 V greater than the second turn-on voltage $V_{T2}$.

With continuing reference to FIG. 2, the line 44 illustrates that the RF gain of the heterojunction bipolar transistor 10 begins to increase at a $V_{CE}$ 48, eventually reaching a stable RF gain at a $V_{CE}$ 50. In other words, the heterojunction bipolar transistor 10 has a corresponding RF knee 52 at the $V_{CE}$ 50, wherein an "RF knee" is the point at which the RF gain approximately plateaus even as the $V_{CE}$ increases. On the other hand, the dashed line 46 illustrates that the RF gain of the conventional double heterojunction bipolar transistor begins to increase at a $V_{CE}$ 54, eventually reaching a stable RF gain at a $V_{CE}$ 56. Thus, the conventional heterojunction bipolar transistor has an RF knee 58 at the $V_{CE}$ 56. Notably, the $V_{CE}$ 54 at which the heterojunction bipolar transistor 10 achieves the RF knee 52 is lower than the $V_{CE}$ 56 at which the conventional double heterojunction bipolar transistor achieves the RF knee 58. Thus, as illustrated by the graph 42, configuring the heterojunction bipolar transistor 10 such that the first turn-on voltage $V_{T1}$ is higher than the second turn-on voltage $V_{T2}$ allows the heterojunction bipolar transistor 10 to achieve higher RF gain at lower supply voltages (i.e., $V_{CE}$) as compared to conventional double heterojunction bipolar transistors.

Figure 3:
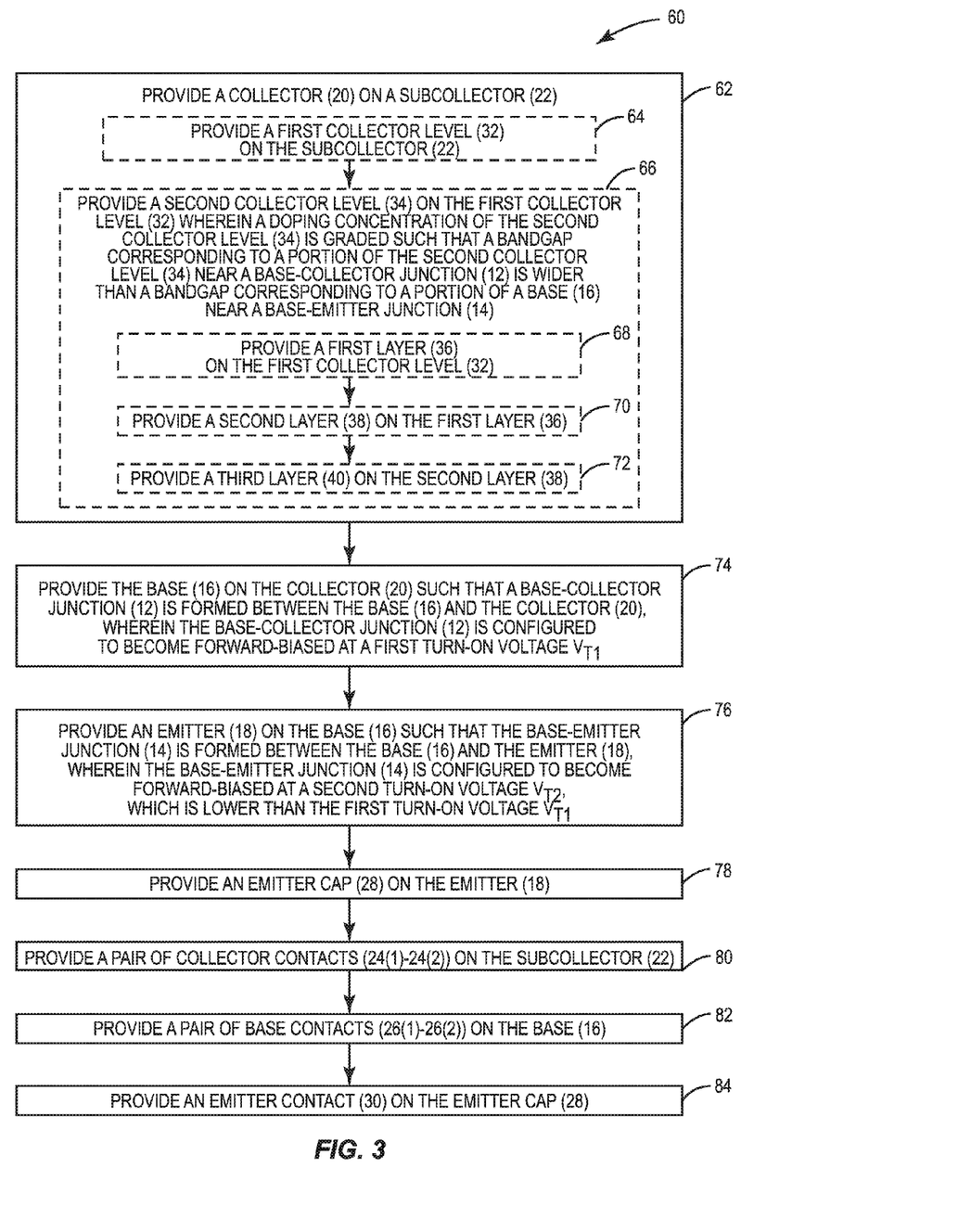
FIG. 3 is a flowchart illustrating an exemplary process for manufacturing the heterojunction bipolar transistor in FIG. 1.

FIG. 3 and the following FIGS. 4A-4H illustrate a process 60 for manufacturing the heterojunction bipolar transistor 10 as shown in FIG. 1. The process 60 includes providing the collector 20 on the subcollector 22 (step 62). Providing the collector 20 in step 62 may include providing the first collector level 32 on the subcollector 22 (step 64 and FIG. 4A). Providing the collector 20 in step 62 may further include providing the second collector level 34 on the first collector level 32 (step 66). Notably, a doping concentration of the second collector level 34 is graded such that a bandgap corresponding to a portion of the second collector level 34 near the base-collector junction 12 is wider than a bandgap corresponding to a portion of the base 16 near the base-emitter junction 14. Further, the second collector level 34 may be divided into separate layers, wherein providing the second collector level 34 includes providing the first layer 36 on the first collector level 32 (step 68 and FIG. 4B), providing the second layer 38 on the first layer 36 (step 70 and FIG. 4C), and providing the third layer 40 on the second layer 38 (step 72 and FIG. 4D).

Figure 4A:
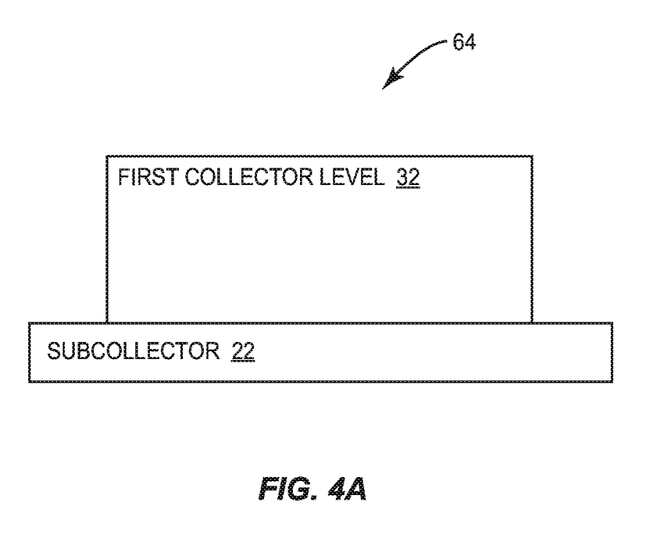
FIGS. 4A-4H illustrate the process described in FIG. 3 for manufacturing the heterojunction bipolar transistor in FIG. 1.
Figure 4B:
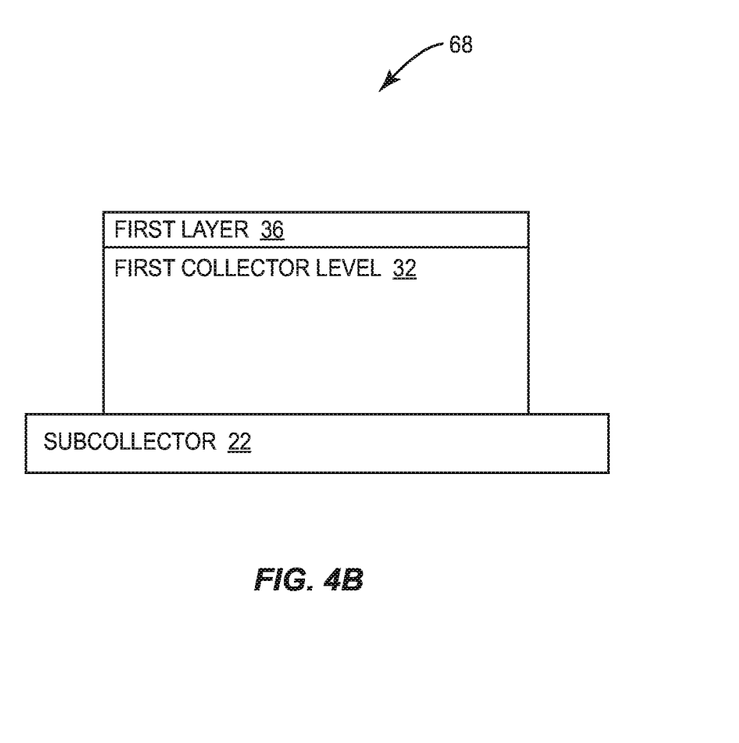
Figure 4C:
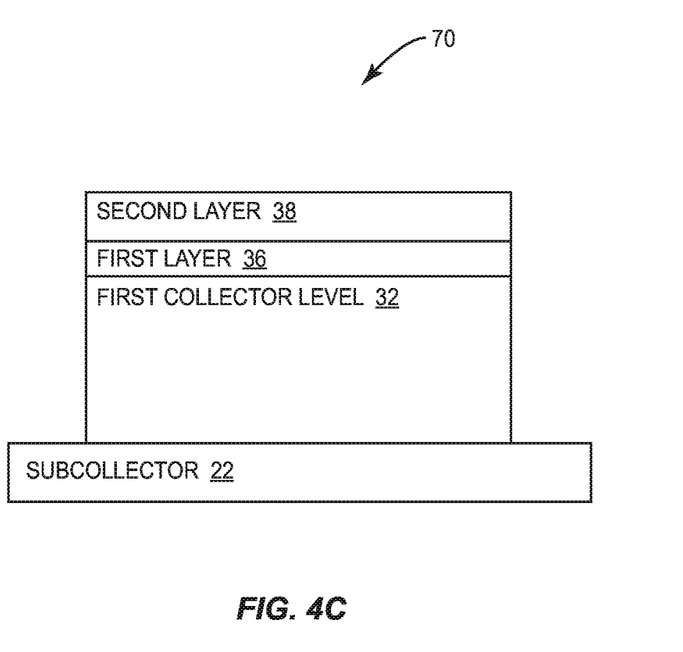
Figure 4D:
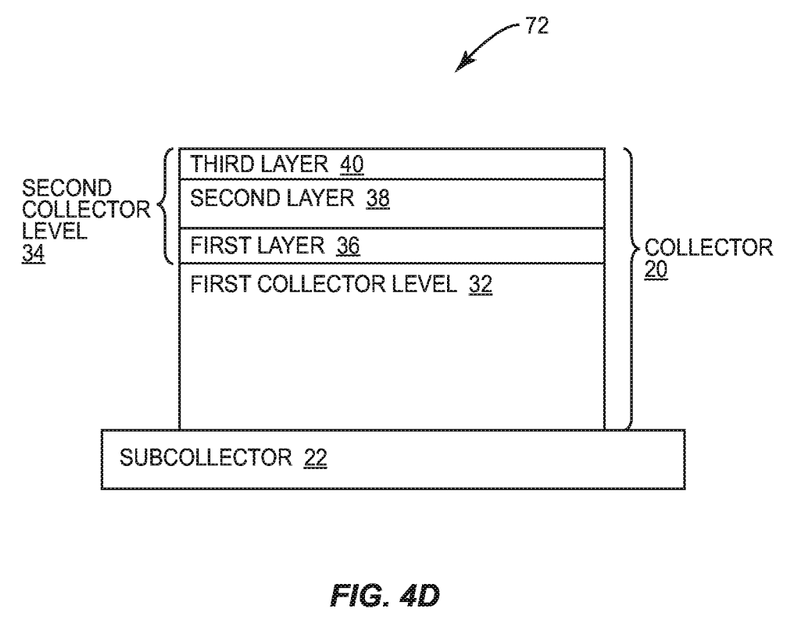
Figure 4E:
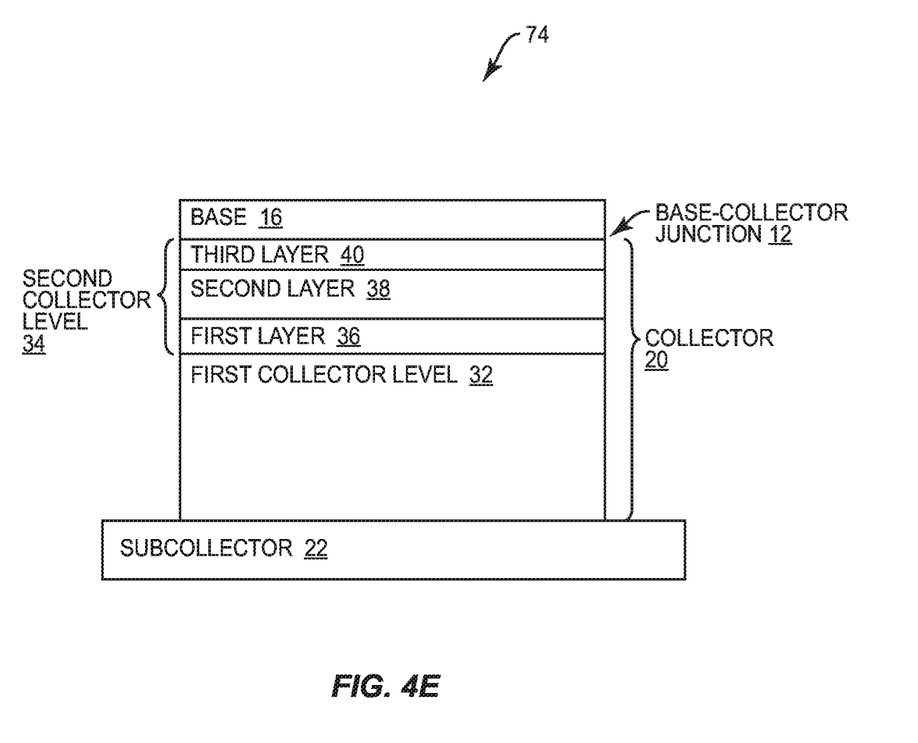
Figure 4F:
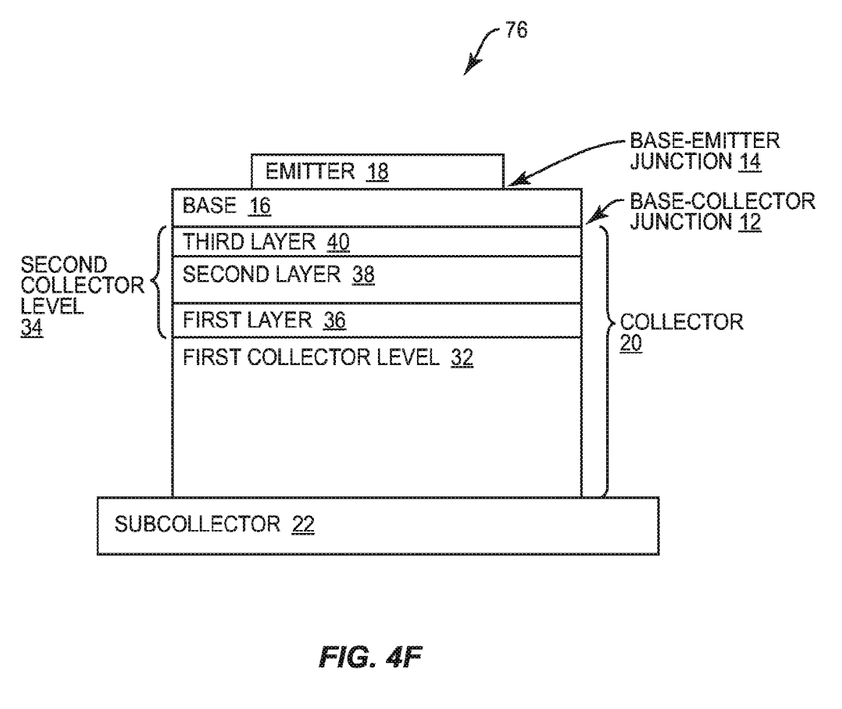
Figure 4G:
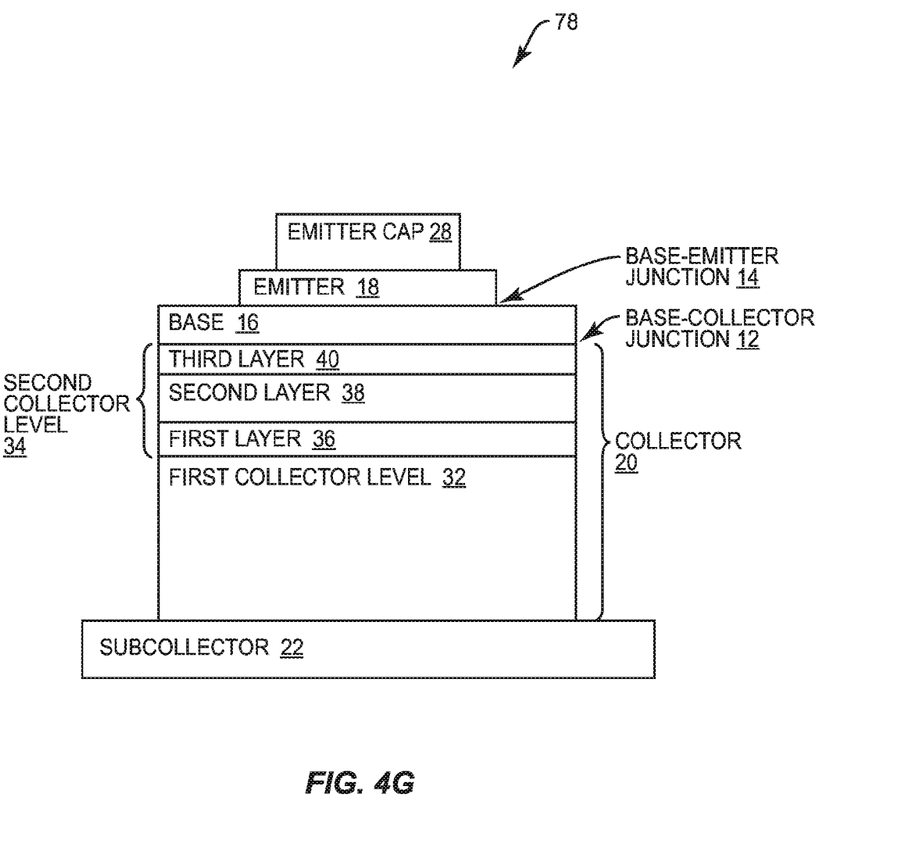
Figure 4H:
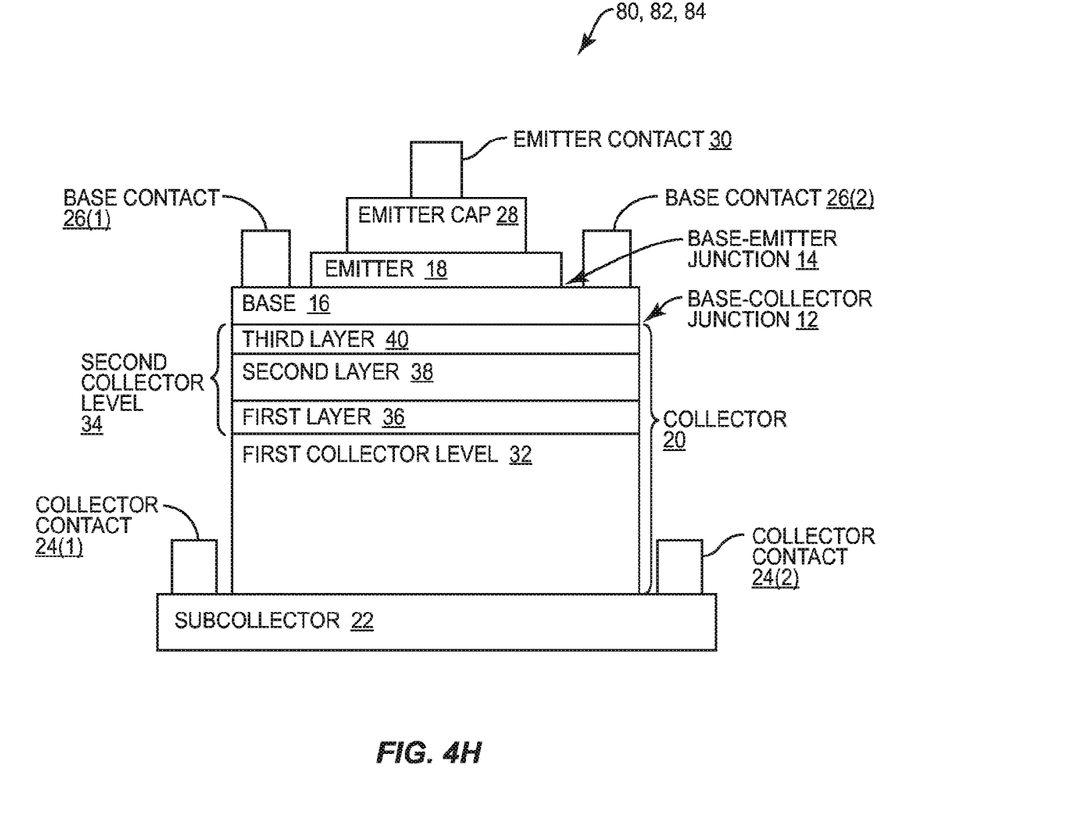

In addition to providing the collector 20, the process 60 includes providing the base 16 on the collector 20 such that the base-collector junction 12 is formed between the base 16 and the collector 20 (step 74 and FIG. 4E). Notably, the base-collector junction 12 is configured to become forward-biased at the first turn-on voltage $V_{T1}$. The process 60 also includes providing the emitter 18 on the base 16 such that the base-emitter junction 14 is formed between the base 16 and the emitter 18 (step 76 and FIG. 4F). Notably, the base-emitter junction 14 is configured to become forward-biased at the second turn-on voltage $V_{T2}$, which is lower than the first turn-on voltage $V_{T1}$. The process 60 also includes providing the emitter cap 28 on the emitter 18 (step 78 and FIG. 4G). Further, the process 60 includes providing the pair of collector contacts 24(1)-24(2) on the subcollector 22 (step 80 and FIG. 4H), providing the pair of base contacts 26(1)-26(2) on the base 16 (step 82 and FIG. 4H), and providing the emitter contact 30 on the emitter cap 28 (step 84 and FIG. 4H).

Figure 5:
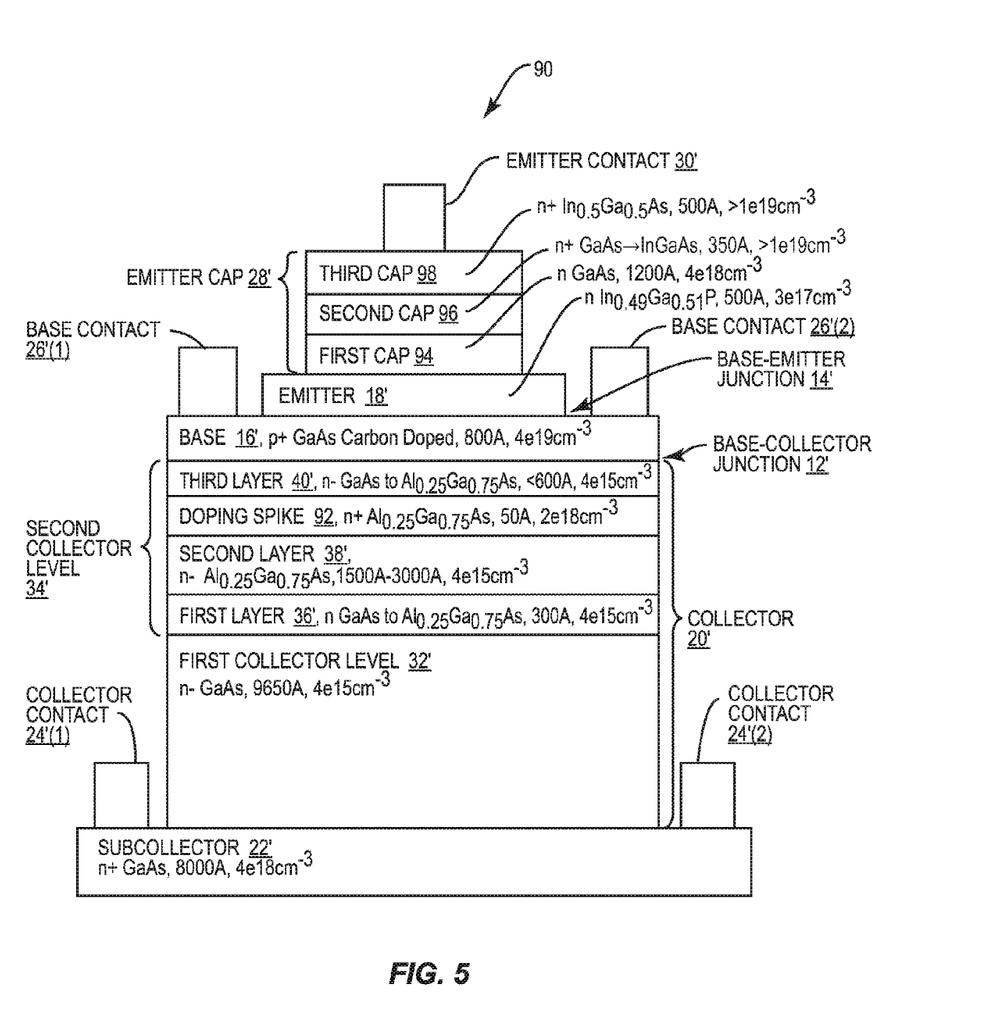
FIG. 5 is a cross-sectional diagram of another exemplary heterojunction bipolar transistor wherein a first turn-on voltage of a base-collector junction is higher than that of a second turn-on voltage of a base-emitter junction.

As discussed above, a heterojunction bipolar transistor, such as the heterojunction bipolar transistor 10 in FIG. 1, may be configured to have a first turn-on voltage $V_{T1}$ that is higher than a second turn-on voltage $V_{T2}$ by way of the material used for the collector 20 and manipulation of doping concentrations and/or composition gradient. In this manner, FIG. 5 illustrates an exemplary heterojunction bipolar transistor 90 employing particular materials, doping concentrations, and composition gradients such that a first turn-on voltage $V_{T1}$ of a base-collector junction 12' is higher than that of a second turn-on voltage $V_{T2}$ of a base-emitter junction 14'. By being configured as described below, a higher voltage is needed to place the base-collector junction 12' into forward-bias, thereby reducing the $C_{BC}$ and improving RF gain of the heterojunction bipolar transistor 90 at lower supply voltages. Notably, the heterojunction bipolar transistor 90 includes similar components as the heterojunction bipolar transistor 10 in FIG. 1. Such components having the number "X" in FIG. 1 have a number "X'" in FIG. 5, and thus will not be re-described herein.

The subcollector 22' in the heterojunction bipolar transistor 90 is formed from Gallium-Arsenide (GaAs) and is approximately 8000 angstroms (A) thick. The subcollector 22' is N-doped layer with a doping concentration of about $4e18$ $cm^{-3}$. The first collector level 32' in the heterojunction bipolar transistor 90 is formed over the subcollector 22' from GaAs and is approximately 9560 A thick. The first collector level 32' is an N-doped layer with a doping concentration of about $4e15$ $cm^{-3}$. Further, so as to help achieve a graded bandgap in the second collector level 34' that increases as the distance to the base-collector junction 12' decreases, the first layer 36' is approximately 300 A thick and is compositionally graded from GaAs to Aluminum$_{0.25}$-Gallium$_{0.75}$-Arsenide (Al$_{0.25}$Ga$_{0.75}$As) (i.e., a mixture of approximately 25% AlAs and 75% GaAs). Further, the first layer 36' is formed over the first collector level 32' and is an N-doped layer with a doping concentration of about $4e15$ $cm^{-3}$.

The second layer 38' is approximately between 1500 A and 3000 A thick and formed over the first layer 36' from Al$_{0.25}$Ga$_{0.75}$As. The second layer 38' is an N-doped layer with a doping concentration of about $4e15$ $cm^{-3}$. Notably, in this embodiment, a doping spike 92 is formed between the second layer 38' and the third layer 40'. The doping spike 92 is formed from Al$_{0.25}$Ga$_{0.75}$As, is approximately 50 A thick, and provides a doping concentration of about $2e18$ $cm^{-3}$. Further, the third layer 40' is approximately less than 600 A thick and formed over the doping spike 92 and the second layer 38'. The third layer 40' is compositionally graded from Al$_{0.25}$Ga$_{0.75}$As to GaAs, and has an N-doped doping concentration of about $4e15$ $cm^{-3}$. Additionally, the base 16' is formed over the third layer 40' from GaAs. The base 16' is a P-doped layer and is approximately 800 A thick with a doping concentration of about $4e19$ $cm^{-3}$.

Further, the emitter 18' is formed over the base 16' from Indium$_{0.49}$-Gallium$_{0.51}$Phosphide (In$_{0.49}$Ga$_{0.51}$P) (i.e., a mixture of approximately 49% InP and 51% GaP). The emitter 18' is an N-doped layer and is approximately 500 A thick with a doping concentration of about $3e17$ $cm^{-3}$. The emitter cap 28' is formed over the emitter 18', wherein the emitter cap 28' includes a first cap 94, a second cap 96, and a third cap 98. The first cap 94 is formed over the emitter 18' from GaAs and is an N-doped layer that is approximately 1200 A thick having a doping concentration of about $4e18$ $cm^{-3}$. The second cap 96 is formed over the first cap 94 and is graded from GaAs to Indium-Gallium-Arsenide (In-GaAs). The second cap 96 is approximately 350 A thick and has a doping concentration of greater than $1e19$ $cm^{-3}$. The third cap 98 is formed over the second cap 96 from In$_{0.5}$Ga$_{0.5}$As (i.e., a mixture of approximately 50% InAs and 50% GaAs). The third cap 98 is an n-doped layer and is approximately 500 A thick with a doping concentration of greater than $1e19$ $cm^{-3}$. By configuring the collector 20' and the base 16' with the materials and doping concentrations described above, the portion of the collector 20' near the base-collector junction 12' is configured to have a wider bandgap than a bandgap of a portion of the base 16' near the base-emitter junction 14'.

Notably, although the embodiment in FIG. 5 illustrates an N-P-N heterojunction bipolar transistor 90, alternative embodiments may include P-N-P heterojunction bipolar transistors.

In addition to the embodiment described in FIG. 5, those skilled in the art will appreciate that other embodiments may include alternative materials, doping concentrations, and/or composition gradients. As non-limiting examples, a heterojunction bipolar transistor having a GaAs subcollector (i.e., substrate) may include the following combination of materials for the respective layers having a range of lattice constants appropriate so as not to exceed strain limits for the material system: Indium-Gallium-Phosphide/Indium-Gallium-Arsenide-Nitride/Indium-Gallium-Phosphide, Indium-Gallium-Phosphide/Indium-Gallium-Arsenide/Indium-Gallium-Phosphide, or Indium-Gallium-Phosphide/Gallium-Arsenide-Antimonium/Indium-Gallium-Phosphide.

Notably, in any of the previous combinations, Indium-Gallium-Phosphide may be replaced by Aluminum-Gallium-Arsenide or Indium-Gallium-Aluminum-Phosphide, and the base may employ composition grading such that the base-emitter junction has a lower turn-on voltage (i.e., the second turn-on voltage $V_{T2}$), while the base-collector junction has a higher turn-on voltage (i.e., the first turn-on voltage $V_{T1}$).

Additional non-limiting examples include a heterojunction bipolar transistor having an Indium-Phosphide substrate that may include the following combination of materials for the respective layers having a range of lattice constants appropriate so as not to form strained layers: Indium-Aluminum-Arsenide/Indium-Gallium-Arsenide/Indium-Aluminum-Arsenide, Indium-Phosphide/Indium-Gallium-Arsenide/Indium-Aluminum-Arsenide, or Indium-Aluminum-Arsenide/Gallium-Arsenide-Antimonium/Indium-Aluminum-Arsenide.

Further non-limiting examples include a heterojunction bipolar transistor having a silicon substrate that may include the following combination of materials for the respective layers having a range of lattice constants appropriate so as not to form strained layers: Silicon/Silicon-Germanium/Silicon-Germanium-Carbide or Silicon/Silicon-Germanium/Silicon-Carbide.

Those skilled in the art will recognize improvements and modifications to the embodiments of the present disclosure. All such improvements and modifications are considered within the scope of the concepts disclosed herein and the claims that follow.

What is claimed is:

1. A heterojunction bipolar transistor comprising:
   a collector;
   a base formed over the collector such that a base-collector junction is formed between the base and the collector, wherein the base-collector junction is configured to become forward-biased at a first turn-on voltage; and
   an emitter formed over the base such that a base-emitter junction is formed between the base and the emitter, wherein the base-emitter junction is configured to become forward-biased at a second turn-on voltage, which is lower than the first turn-on voltage.

2. The heterojunction bipolar transistor of claim 1 wherein the first turn-on voltage is between 0.1 volts and 0.4 volts higher than the second turn-on voltage.

3. The heterojunction bipolar transistor of claim 1 wherein the first turn-on voltage is above 1.3 volts.

4. The heterojunction bipolar transistor of claim 1 configured as a double heterojunction bipolar transistor.

5. The heterojunction bipolar transistor of claim 1 wherein a composition gradient of the base is graded such that a bandgap corresponding to a portion of the base near the base-collector junction is wider than a bandgap corresponding to a portion of the base near the base-emitter junction.

6. The heterojunction bipolar transistor of claim 1 wherein the collector comprises:
   a first collector level formed over a subcollector; and
   a second collector level formed over the first collector level wherein a doping concentration of the second collector level is graded such that a bandgap corresponding to a portion of the second collector level near the base-collector junction is wider than a bandgap corresponding to a portion of the base near the base-emitter junction.

7. The heterojunction bipolar transistor of claim 6 wherein the second collector level comprises:
   a first layer formed over the first collector level;
   a second layer formed over the first layer; and
   a third layer formed over the second layer.

8. The heterojunction bipolar transistor of claim 7 wherein:
   the first layer has a doping concentration between $1e15$ $cm^{-3}$ and $1e16$ $cm^{-3}$;
   the second layer has a doping concentration between $1e18$ $cm^{-3}$ and $1e20$ $cm^{-3}$; and
   the third layer has a doping concentration between $1e15$ $cm^{-3}$ and $1e16$ $cm^{-3}$.

9. The heterojunction bipolar transistor of claim 8 further comprising:
   an emitter cap formed on the emitter;
   a pair of collector contacts formed on the subcollector;
   a pair of base contacts formed on the base; and
   an emitter contact formed on the emitter cap.

10. The heterojunction bipolar transistor of claim 9 wherein the emitter cap comprises:
    a first cap formed on the emitter;
    a second cap formed on the first cap; and
    a third cap formed on the second cap.

11. The heterojunction bipolar transistor of claim 7 wherein the subcollector comprises Gallium-Arsenide.

12. The heterojunction bipolar transistor of claim 11 wherein the first collector level is formed from Gallium-Arsenide over the subcollector.

13. The heterojunction bipolar transistor of claim 12 wherein:
    the first layer of the second collector level is formed from Gallium-Arsenide compositionally graded into Aluminum-Gallium-Arsenide;
    the second layer of the second collector level is formed from Aluminum-Gallium-Arsenide; and
    the third layer of the second collector level is formed from Aluminum-Gallium-Arsenide.

14. The heterojunction bipolar transistor of claim 13 wherein the base is formed from Gallium-Arsenide.

15. The heterojunction bipolar transistor of claim 14 wherein the emitter is formed from Indium-Gallium-Arsenide.

16. The heterojunction bipolar transistor of claim 15 wherein the subcollector is approximately 8000 angstroms thick and has a doping concentration approximately equal to $4e18$ $cm^{-3}$.

17. The heterojunction bipolar transistor of claim 16 wherein the first collector level is approximately 9650 angstroms thick and has a doping concentration approximately equal to $4e15$ cm$^{-3}$.

18. The heterojunction bipolar transistor of claim 17 wherein:
 the first layer is approximately 300 angstroms thick and has a doping concentration approximately equal to $4e15$ cm$^{-3}$;
 the second layer is approximately between 1500 angstroms and 3000 angstroms thick and has a doping concentration approximately equal to $4e15$ cm$^{-3}$;
 a doping spike is formed of Aluminum-Gallium-Arsenide between the second layer and the third layer wherein the doping spike is approximately 50 angstroms thick and has a doping concentration approximately equal to $2e18$ cm$^{-3}$; and
 the third layer is approximately less than 600 angstroms thick and has a doping concentration approximately equal to $4e15$ cm$^{-3}$.

19. The heterojunction bipolar transistor of claim 18 wherein the base is approximately 800 angstroms thick and has a doping concentration approximately equal to $4e19$ cm$^{-3}$.

20. The heterojunction bipolar transistor of claim 19 wherein the emitter is approximately 500 angstroms thick and has a doping concentration approximately equal to $3e17$ cm$^{-3}$.

21. A heterojunction bipolar transistor comprising:
 a base formed over a collector wherein a base-collector junction is formed between the base and the collector;
 an emitter formed over the base wherein a base-emitter junction is formed between the base and the emitter, the emitter having a bandgap near the base-emitter junction approximately equal to 1.32 electronvolts (eV); and
 the collector having a bandgap near the base-collector junction that is approximately equal to 1.42 eV so that a turn-on voltage of the base-collector junction is higher than a turn-on voltage of the base-emitter junction.

22. The heterojunction bipolar transistor of claim 21 wherein the bandgap of the collector decreases as a distance from the base-collector junction increases.

23. A method for manufacturing a heterojunction bipolar transistor comprising:
 providing a collector on a subcollector;
 providing a base on the collector such that a base-collector junction is formed between the base and the collector, wherein the base-collector junction is configured to become forward-biased at a first turn-on voltage;
 providing an emitter on the base such that a base-emitter junction is formed between the base and the emitter, wherein the base-emitter junction is configured to become forward-biased at a second turn-on voltage, which is lower than the first turn-on voltage;
 providing an emitter cap on the emitter;
 providing a pair of collector contacts on the subcollector;
 providing a pair of base contacts on the base; and
 providing an emitter contact on the emitter cap.

24. The method of claim 23 wherein providing the collector comprises:
 providing a first collector level on the subcollector; and
 providing a second collector level on the first collector level wherein a doping concentration of the second collector level is graded such that a bandgap corresponding to a portion of the second collector level near the base-collector junction is wider than a bandgap corresponding to a portion of the base near the base-emitter junction.

25. The method of claim 24 wherein providing the second collector level comprises:
 providing a first layer on the first collector level;
 providing a second layer on the first layer; and
 providing a third layer on the second layer.

* * * * *